United States Patent
Vermeulen et al.

(10) Patent No.: US 7,105,955 B2
(45) Date of Patent: Sep. 12, 2006

(54) LITHOGRAPHIC APPARATUS, COIL ASSEMBLY, POSITIONING DEVICE INCLUDING A COIL ASSEMBLY, AND DEVICE MANUFACTURING METHOD

(75) Inventors: Johannes Petrus Martinus Bernardus Vermeulen, Valkenswaard (NL); Henricus Wilhelmus Aloysius Janssen, Eindhoven (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 11 days.

(21) Appl. No.: 10/825,224

(22) Filed: Apr. 16, 2004

(65) Prior Publication Data

US 2005/0231043 A1    Oct. 20, 2005

(51) Int. Cl.
*H02K 41/02* (2006.01)
*H02K 3/04* (2006.01)
*G03B 27/52* (2006.01)

(52) U.S. Cl. .......................................... 310/12; 355/72
(58) Field of Classification Search .................. 310/12
See application file for complete search history.

(56) References Cited

U.S. PATENT DOCUMENTS

| | | | |
|---|---|---|---|
| 4,767,954 A * | 8/1988 | Phillips | 310/12 |
| 4,839,543 A * | 6/1989 | Beakley et al. | 310/12 |
| 6,265,793 B1 * | 7/2001 | Korenaga | 310/12 |

* cited by examiner

*Primary Examiner*—Burton Mullins
(74) *Attorney, Agent, or Firm*—Pillsbury Winthrop Shaw Pittman, LLP

(57) ABSTRACT

A coil assembly has at least two coils which are arranged in a common plane, and partially overlap in crossover sections of the coils. The crossover sections have a reduced height, which results in a reduced total height of the coil assembly. This leads to a more compact coil assembly, and hence to better dynamic characteristics of a positioning device in which the coil assembly is applied.

22 Claims, 4 Drawing Sheets

LITHOGRAPHIC APPARATUS, COIL ASSEMBLY, POSITIONING DEVICE INCLUDING A COIL ASSEMBLY, AND DEVICE MANUFACTURING METHOD

BACKGROUND OF THE INVENTION

1. Field of the Invention

The present invention relates to a lithographic apparatus, a coil assembly, a positioning device including a coil assembly, and a device manufacturing method using a positioning device.

2. Discussion of the Related Art

A lithographic apparatus is a machine that applies a desired pattern onto a target portion of a substrate. A lithographic apparatus can be used, for example, in the manufacture of integrated circuits (IC's). In that circumstance, a patterning device, such as a mask, may be used to generate a circuit pattern corresponding to an individual layer of the IC, and this pattern can be imaged onto a target portion (e.g., including part of one, or several, dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam in a given direction (the "scanning"-direction) while synchronously scanning the substrate parallel or anti-parallel to this direction.

In a scanner, portions of the substrate are scanned successively. In between a warming of a portion and a scanning of a next portion of the substrate, a movement is made to position the substrate and the patterned beam relative to each other such that scanning of The next portion of the substrate can start. The scanning movement can be performed by moving the substrate, or by moving a suitable pan of the illumination system and/or a suitable part of the projection system. Also, it is possible that each of these elements or any suitable combination thereof is moved thus achieving a desired scanning of the patterned beam relative to the substrate. The moving of the different elements with respect to one another is generally performed using positioning devices. Amongst others, use is made of linear and planar positioning devices.

Linear positioning devices may be applied for moving the substrate table relative to the lithographic apparatus, or moving the patterned beam relative to the lithographic apparatus. In other embodiments of lithographic apparatuses, planar positioning devices may be applied for positioning the substrate table in two directions, e.g. a plane. Other elements of the lithographic apparatus may also be moved by positioning devices.

In the field of manufacturing IC's, it is desirable to increase the speed of production of integrated circuits. One possibility of increasing the speed of production is to move the moveable parts of the lithographic device with respect to one another at a higher speed. This higher speed calls for an improvement of the dynamic behavior of the positioning systems with which the different elements of a lithographic device are moved.

If the maximum accelerations with which positioning devices can displace loads are increased, a movement from a first location to a second location can be conducted at a higher average speed. One possible way to improve the dynamic behavior of a positioning device is to construct the moving part thereof with less mass. If the mass of a positioning device is decreased, the accelerations that it can achieve while applying the same force will be greater, hence enabling movements to be performed at a higher speed. Alternatively, when the same accelerations are performed, the carrying load of the positioning device can be greater.

Linear and planar positioning devices generally include a first part and a second part which are moveable with respect to one another in at least one direction. The first part generally includes an array of fixed magnets arranged in a pattern, having an orientation of the magnetization field which is perpendicular to the direction of movement. Typically, a number of N and S magnets are arranged in an alternating manner, having a distance between each N-pole and S-pole which is indicated as the magnetic pole pitch.

The second part generally includes an assembly of coils, constructed in a common plane with respect to one another. The coils include current conductors in the form of one or more windings. When a current flows in a current conductor, the flux density of the magnetic field created by the magnets exerts a Lorentz force on the current conductors of the coils. The direction of the Lorentz force is oriented perpendicular to the direction of the magnetic field and perpendicular to the extension of the current conductor.

Known positioning devices generally include coil assemblies including two or three coils. The coils generally have substantially the shape of a closed loop, defining an open area within the coil. The coils do not have an iron core, thereby avoiding any magnetic forces between the coil assembly and the array of magnets when no currents are conducted through the coils. A coil generally includes two main current conductor sections, connected to one another by two other sections. In known devices, the coils are positioned in an overlapping configuration, wherein one main current conductor section of a first coil overlaps the open area of a second coil. In order to connect this main current conductor section of the first coil to the rest of the first coil, the first coil is required to cross the second coil in a crossover section thereof outside the main current conductor sections. In the known positioning devices, crossover sections of the first and second coil are stacked on top of one another, thereby increasing the height of a coil assembly at the crossover sections.

Generally, the coil assembly is enclosed in a second enclosing material which keeps the coils in a fixed position relative to one another. Epoxy resin is often used as his second enclosing material. Other materials are also used. If the total height of the coil assembly is large, a relatively large amount of second enclosing material is also necessary in order to enclose the entire coil assembly. This will increase the mass of the coil assembly, leading to a poorer performance in terms of dynamic behavior.

SUMMARY OF THE INVENTION

It is an aspect of the present invention to provide a coil assembly having a reduced height with respect to known coil assemblies. It is another aspect of the present invention to provide a coil assembly having less mass than known coil assemblies. It is another aspect of the present invention to provide a coil assembly having an improved dynamic behavior. It is yet another aspect of the present invention to provide a positioning device having an improved dynamic behavior.

One or more of these and other aspects are achieved with a coil assembly including at least one first coil and the at least one second coil, the coils being arranged in a common plane, the at least one first coil and the at least one second coil overlapping one another partially and defining at least one crossover area where respective crossover sections of the at least one first coil and the at least one second coil cross one another, and the crossover sections having a respective crossover section height perpendicular to the plane, wherein the combined crossover section heights of the crossover sections in the crossover area equal at most a height of the second coil outside the at least one crossover area.

The coils have the form of a substantially closed loop when viewed in a direction perpendicular to the plane. The coils generally include a number of windings and a connection for feeding a current to the coil and a connection for draining a current from the coil. The coils may be wound from a conductor band or strip.

The term "common plane" is to be interpreted as that the coils are positioned coplanarly. The coils are three dimensional objects, having a height perpendicular to the plane, and therefore they extend over that height in a direction perpendicular to the plane. The plane may be flat or curved.

Preferably, the coil assembly includes a first, a second and a third coil which are arranged in a common plane, wherein the first, second and third coils overlap one another partially, wherein in at least one crossover area the respective crossover sections of the first, second and third coils cross one another.

A coil typically includes two main current conductor sections, connected by two other sections comprising crossover sections. The first main current conductor section of a coil conducts current in one direction, while the second main current conductor section conducts current in the opposite direction. When the first and third coil overlap, a configuration is created wherein a set of the three main current conductor sections of the first, second and third coil which conduct current in the same direction, are positioned adjacent to one another, and a second set of main current conductor sections conducting current in the opposite direction is configured adjacent to the first set, the second set including main current conductor sections which are also positioned adjacent to one another. This configuration is well suited to be applied in linear and planar positioning devices.

Also, an efficient stacking of three coils can be accomplished. The coils can be configured in such a way that the main current conductor sections of the second and third coil are positioned within an open area of a first coil. The height of the coil assembly remains equal to the height of a single coil, thus advantageously providing a coil assembly with a low mass. Also, if the three coils cross one another in the same crossover area, the length of the crossover sections can be minimal.

In a preferred embodiment each coil has a first side and a second side, the first and second sides being oriented parallel to the common plane, and the first and second sides being located at a distance from one another, thereby defining the height of the coil, and wherein each crossover section height of each coil is arranged between a first plane and a second plane, wherein the first and second plane are defined by the respective first and second side of the coil. This provides the advantage of keeping the height of the coil assembly equal to the height of a single coil.

Preferably, the crossover section of the second coil is positioned between the crossover sections of the first and third coils in the direction perpendicular to the plane. Advantageously, the coils are stacked in an orderly manner. The coil assembly can be easily constructed, by placing the subsequent coils next to one another, and stacking their crossover sections on top of one another.

Preferably, each respective coil includes at least one winding, and the cross-sectional area of the at least one winding in a crossover section of a respective coil is smaller than the cross-sectional area of the at least one winding outside the crossover section of a respective coil. This embodiment allows the possibility of reducing the height of the respective crossover areas.

In a further preferred embodiment, the respective crossover section heights of the at least one first and the at least one second coil are substantially equal to one another. This provides the effect of keeping the current densities in the respective crossover sections substantially equal.

Preferably, the respective coils of the coil assembly are constructed having a substantially rectangular form, each coil including two long legs and two short legs, and wherein the at least two coils cross one another near the respective short legs. The long legs are also referred to as the main current conductor sections, while (part of) the short legs are also referred to as the crossover sections. The Lorentz force which moves the second part of the positioning device, is exerted on the long legs. The short legs is to connect the two long legs of each coil, which constitute the main current conductor sections of each coil. The short legs do not create any forces for moving the second part of the positioning device. Therefore, a configuration with relatively short crossover sections creates a minimum of unwanted forces, minimizes the dimensions of the coils, makes the coil assembly more compact and thereby minimizes the mass of each coil assembly.

The invention also relates to a positioning device including a first part and a second part which are displaceable with respect to one another in at least one direction, the first part including a system of magnets, the second part including a coil assembly as described herein above. The disclosed positioning device is more compact in size, has a lower mass and hence, an enhanced dynamic behavior in terms of accelerations that can be achieved and/or loads that can be displaced.

It is also possible to apply the coil assembly in an inductive planar positioning device. In such a device, the array of magnets is replaced by a conductive plate, for instance manufactured from copper or aluminum.

A method according to The present invention for device manufacturing includes providing a beam of radiation using an illumination system; using a patterning device to impart the beam with a pattern in its cross-section; projecting the patterned beam of radiation onto a target portion of a substrate; and providing a positioning device including a first pan and a second part which are displaceable with respect to one another in at least one direction, the first part including a system of magnets, the second part including a coil assembly including a; least one first coil and at least one second coil, the coils being arranged in a common plane, the at least one first coil and the at least one second coil overlapping one another partially and defining at least one crossover area where respective crossover sections of the at least one first coil and at least one second coil cross one another, the crossover sections having a respective crossover section height perpendicular to the common plane. and wherein the combined crossover section heights of the crossover sections in the crossover area equal at most a height of second coil outside the at least one crossover area; connecting the first part to one of a support for the patterning device and a table for the substrate; connecting the second part to the other of the support and the table; and moving the support and the table with respect to each other using the positioning device.

Although specific reference may be made in this text to the use of lithographic apparatus in the manufacture of IC's, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of a patterning device, the support may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables) but may also be of a single stage type or comprise a single substrate table. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
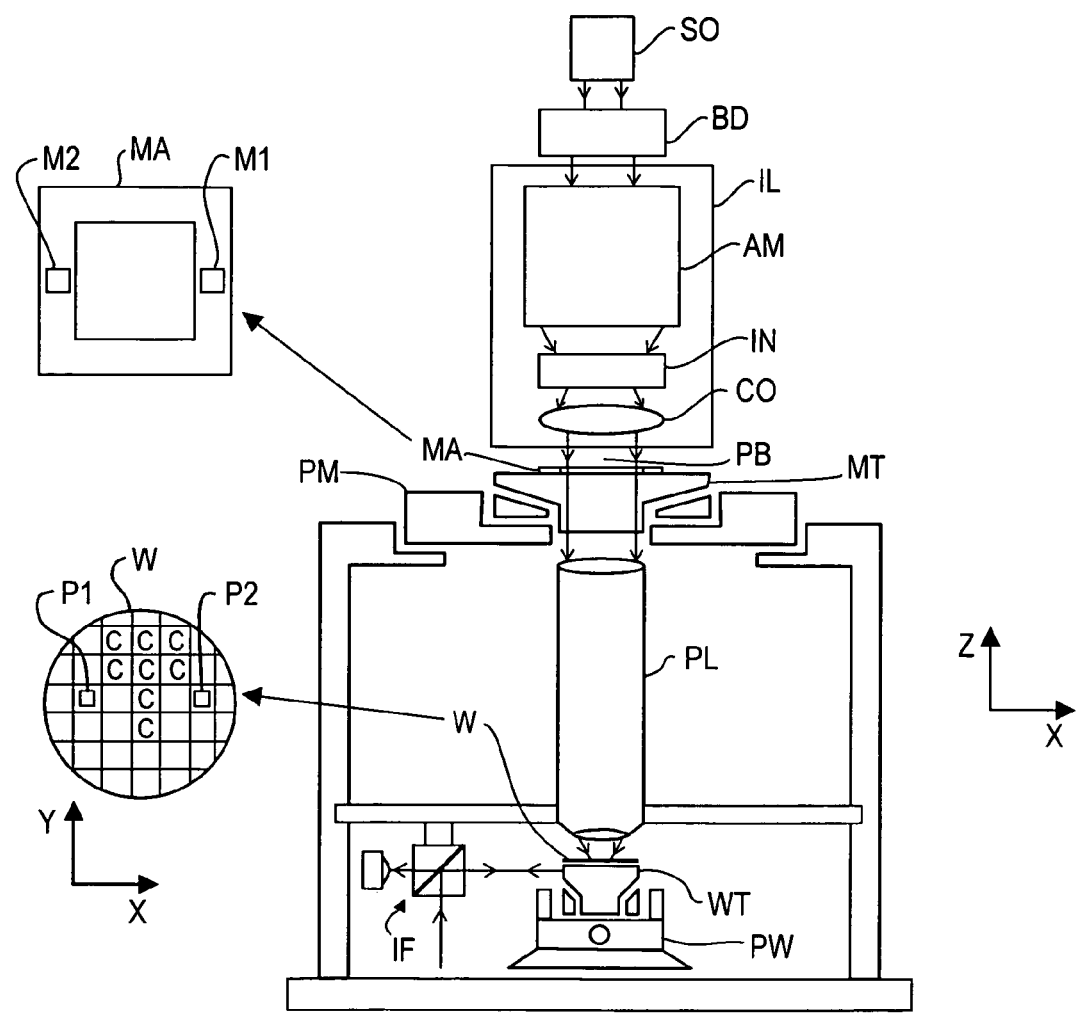
FIG. 1 schematically shows a lithographic apparatus according to an embodiment of the present invention.

FIG. 1 schematically depicts a lithographic apparatus including an illumination system (illuminator) IL configured to provide a beam PB of radiation (e.g. UV or EUV radiation). A first support (e.g. a mask table) MT supports a patterning device (e.g. a mask) MA and is connected to a first positioning device PM that accurately positions the patterning device with respect to a projection system ("lens") PL. A substrate table (e.g. a wafer table) WT holds a substrate (e.g. a resist-coated wafer) W and is connected to a second positioning device PW that accurately positions the substrate with respect to the projection system PL. The projection system (e.g. a reflective projection lens) PL images a pattern imparted to the beam PB by the patterning device MA onto a target portion C (e.g. including one or more dies) of the substrate W.

As here depicted, the apparatus is of a transmissive type (e.g. employing a transmissive mask or a programmable mirror array of a type as referred to above). Alternatively, the apparatus may be of a reflection type (e.g. employing a reflection mask).

The illuminator IL receives radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation having a desired uniformity and intensity distribution in its cross-section.

The beam PB is incident on the mask MA, which is held on the mask table MT. Being transmitted by the mask MA, the beam PB passes through the lens PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
1. In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It should be appreciated that the principles of the present invention, and the exemplary embodiments thereof, cannot only be applied with a lithographic apparatus of the transmissive type as described with reference to FIG. 1, however may also be used with a lithographic apparatus of the reflective type or any combination thereof.

The lithographic apparatus can also be described as an illumination system to provide a beam of radiation, a support to support a patterning device, the patterning device configured to impart the beam with a pattern in its cross-section, a substrate table to hold a substrate, a projection system to project the patterned beam onto a target portion of the substrate, and a scanning mechanism to move the patterned beam and the substrate with respect to each other.

Figure 2:
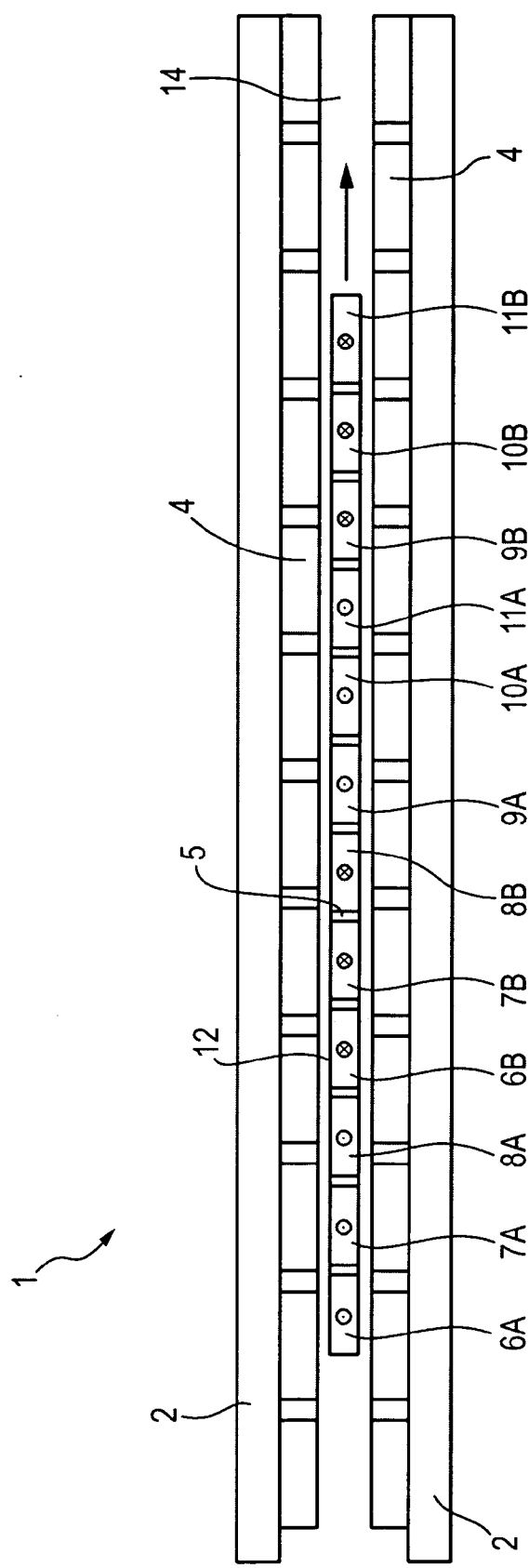
FIG. 2 shows a top view of linear positioning device of the prior art.

FIG. 2 shows a top view of a linear positioning device 1 of the prior art. Iron plates 2 are constructed in a coplanar orientation with respect to one another. Between the iron plates 2, two arrays 4 of magnets are configured, defining a channel 14 which extends between the arrays 4 of magnets, in a direction parallel to the arrays of magnets. In the channel 14, a second part 5 of the positioning device 1 is moveably arranged, including a coil assembly 12. The coil assembly 12 includes six coils 6, 7, 8, 9, 10 and 11. The coil 6 includes two main current conductor sections 6A and 6B, which extend in a direction perpendicular to the plane of the Figure, and carry the same, but oppositely directed currents. The main current conductor sections 7A and 8A are positioned between the current conductor sections 6A and 6B of coil 6. The other coils 8, 9, 10 and 11 are constructed in the same way and also have two main current conductor sections (8A and 8B, 9A and 9B, 10A and 10B, and 11A and 11B).

Figure 3:
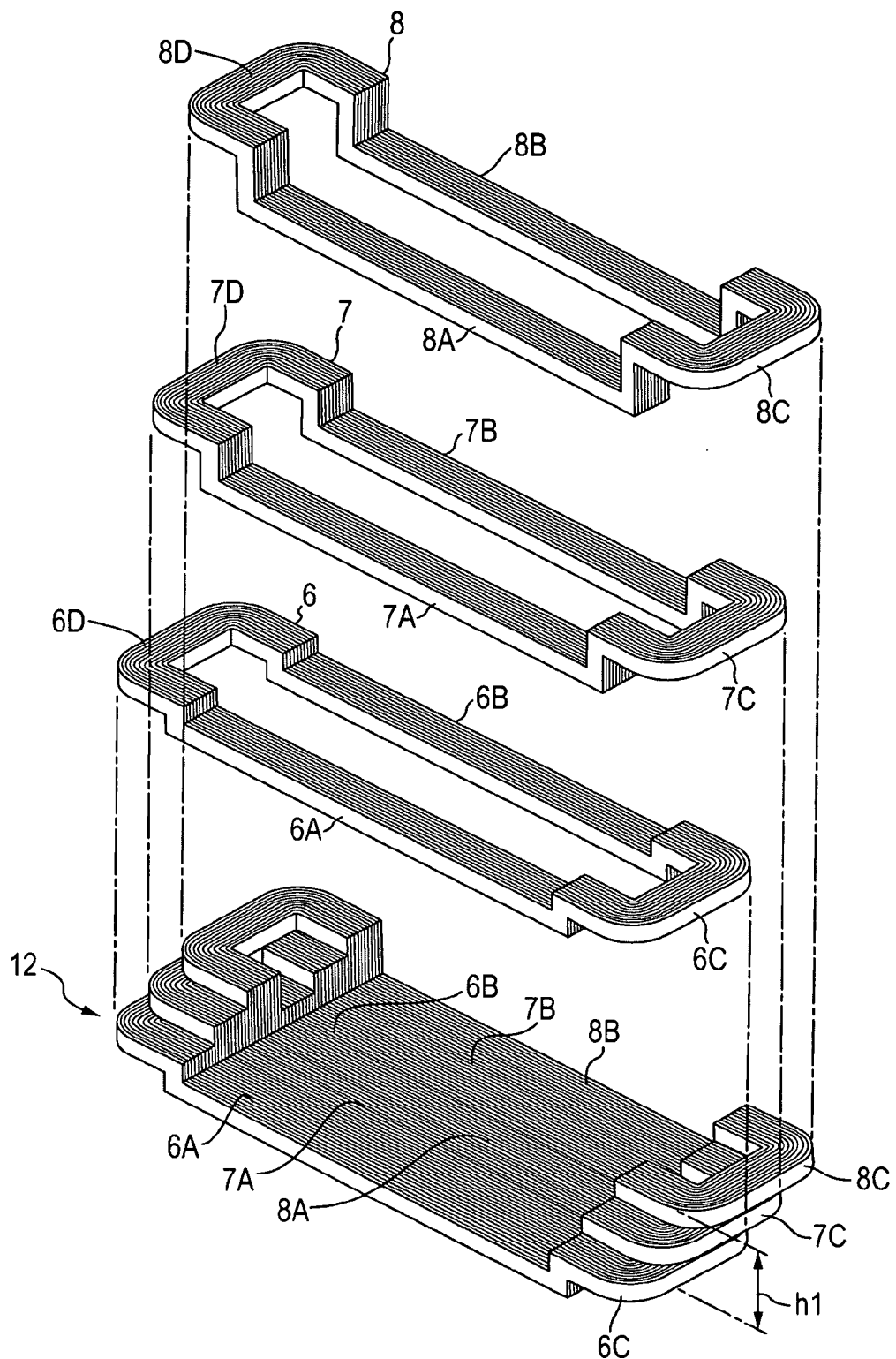
FIG. 3 shows an exploded and assembled view of a planar positioning device of the prior art.

FIG. 3 shows an exploded view of the coil assembly 12 of FIG. 2. Three coils 6, 7 and 8 each include main current conductor sections 6A and 6B, 7A and 7B, and 8A and 8B, respectively. The three coils 6, 7 and 8 each also comprise crossover sections 6C and 6D, 7C and 7D, and 8C and 8D, respectively. The three coils 6, 7 and 8 are positioned in an overlapping manner, wherein the current conductor sections 7B and 8B fill the open area between the current conductor sections 6A and 6B of coil 6. In this configuration, the crossover sections 6C, 7C and 8C on one side of the coil assembly 12 and the crossover sections 6D, 7D and 8D on the other side of the coil assembly 12 will overlap one another at least partially. It can be seen that the height h1 of the coil assembly near the crossover sections 6C, 6D, 7C, 7D, 8C and 8D is greater than the height of the coil assembly near the current conductor sections 6A, 6B, 7A, 7B, 8A and 8B.

Figure 4:
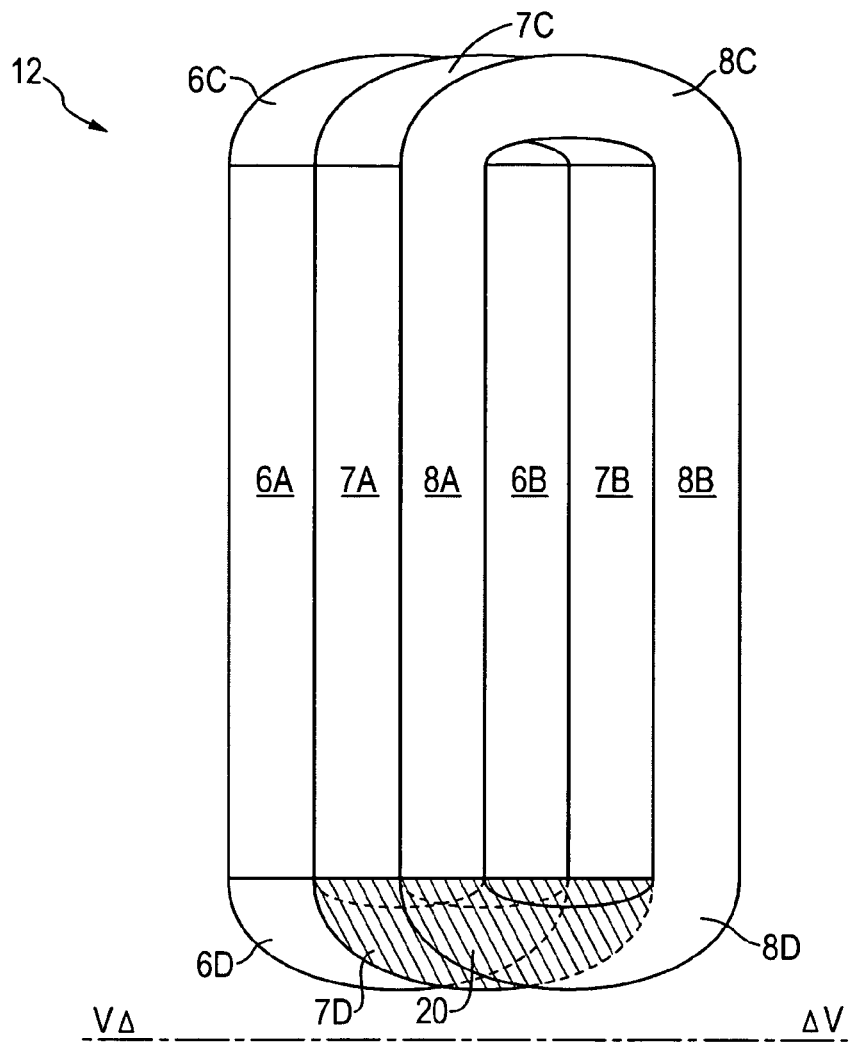
FIG. 4 shows a top view of an exemplary embodiment of a coil assembly according to the present invention.
Figure 5:
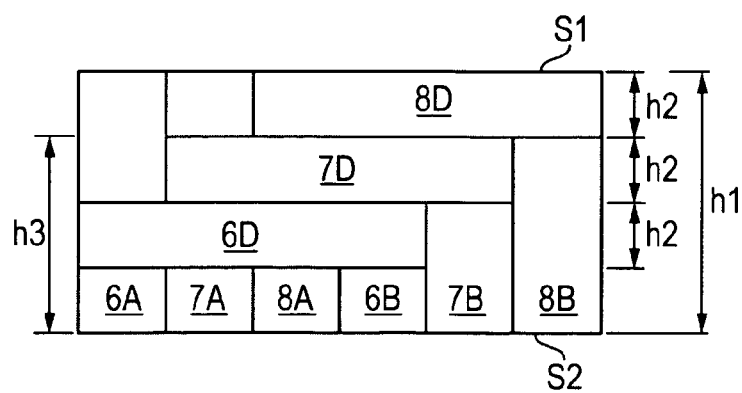
FIG. 5 shows a side view of a coil assembly of FIG. 4 according to line V—V in FIG. 4.

FIGS. 4 and 5 show a configuration of three coils 6, 7, and 8 according to the present invention. Each coil 6, 7 and 8 includes two main current conductor sections 6A and 6B, 7A and 7B, and 8A and 8B, respectively, which lie in parallel to one another. Further, each coil 6, 7 and 8 includes two crossover sections 6C and 6D, 7C and 7D, and 8C and 8D, respectively, which connect the two main current conductor sections of the respective coil with one another. Each coil 6, 7 and 8 includes an open area (not shown), bounded by the two main current conductor sections xA and xB and the two crossover sections xC and xD (x=6, 7, 8). The coils 6, 7, and 8 are configured in a partially overlapping position, wherein the main current conductor sections 7A and 8A are positioned within an open area of coil 6. In turn, main current conductor sections 8A and 6B are positioned within an open area of coil 7. And lastly, main current conductor sections 6B and 7B are positioned within an open area of coil 8. A crossing area 20 is defined as the area wherein the respective crossover sections 6D, 7D and 8D of the coils cross one another.

In operation, in one main current conductor section 6A a current flows perpendicular to the shown plane in FIG. 5, in a direction away from the viewer, and in the other conductor section 6B conducts a current flows perpendicular to the shown plane, in a direction towards the viewer.

Turning to FIG. 5, the coil assembly 12 is shown having a first side S1, a second side S2 and a height h1. Here, the sides S1 and S2 are shown as the top side and the bottom side of the coil assembly 12. However, it should be appreciated that the coil assembly can be oriented in any direction. The crossover sections of each coil 6, 7 and 8 have a crossover section height h2. The crossing heights h2 are chosen such that the combined crossover section heights h2 are smaller than the coil height h1 and are equal to at most a height $h_3$ of the second coil 7 outside the crossing area 20. This allows the respective crossover sections to be configured between the two planes defined by the respective sides S1 and S2. Therefore, the crossover sections do not extend beyond the planes defined by S1 and a reduced height of the coil assembly 12. In a typical coil configuration, the coils are enclosed in another material (not shown), often a synthetic material such as an epoxy resin. The reduced height of the coil assembly 12 allows the use of less epoxy in order to enclose the coils therein. Less material implies that the coil assembly will have less mass. When the coil assembly, and thus the moving part 5 of the positioning device 1, has less mass, greater accelerations can be achieved with the same force, or the same accelerations can be achieved with a lower force, thus leading to improved dynamic characteristics of the positioning device 1.

While specific embodiments of the present invention have been described above, it will be appreciated that the invention may be practiced otherwise than as described. The description is not intended to limit the present invention.

What is claimed is:

1. A coil assembly, comprising:
a first coil; and
a second coil, wherein the coils are arranged in a common plane, the first coil and the second coil overlapping one another partially and defining at least one crossover area where respective crossover sections of the first coil and the second coil cross one another, and the crossover sections having a respective crossover section height perpendicular to the common plane, the combined crossover section heights of the crossover sections in the crossover area equal at most a height of the second coil outside the at least one crossover area.

2. A coil assembly according to claim 1, further comprising a third coil, wherein the first coil and the second coil and the third coil are arranged in a common plane, wherein the first, second and third coil overlap one another partially in at least one crossover area and in the at least one crossover area the respective crossover sections of the first, second and third coils cross over one another.

3. A coil assembly according to claim 1, wherein each coil has a first side and a second side, the first and second sides being oriented parallel to the common plane, the first and second sides being located at a distance from one another, thereby defining the height of the coil, each crossover section height of each coil is arranged between a first plane and a second plane, and the first and second plane are defined by the respective first and second sides of each coil.

4. A coil assembly according to claim 2, wherein the crossover section of the second coil is positioned between the crossover sections of the first and third coils in a direction perpendicular to the common plane.

5. A coil assembly according to claim 1, wherein each respective coil comprises at least one winding, and wherein the cross-sectional area of the at least one winding in a crossover section of a respective coil is smaller than the cross-sectional area of the at least one winding outside the crossover section of the respective coil.

6. A coil assembly according to claim 1, wherein the respective crossover section heights of the first and the second coil are substantially equal to one another.

7. A coil assembly according to claim 1, wherein the respective coils are constructed having a substantially rectangular form, each coil comprising two long legs and two short legs, and wherein the first and coils cross one another in an area of the respective short legs.

8. A positioning device, comprising:
a first part and a second part which are displaceable with respect to one another in at least one direction,
the first part comprising a system of magnets,
the second part comprising a coil assembly comprising a first coil and a second coil, the coils being arranged in a common plane, the first coil and the second coil overlapping one another partially and defining at least one crossover area where respective crossover sections of the first coil and the second coil cross one another, the crossover sections having a respective crossover section height perpendicular to the common plane, wherein the combined crossover section heights of the crossover sections in the crossover area equal at most a height of the second coil outside the at least one crossover area.

9. A positioning device according to claim 8, wherein the at least one direction extends parallel to the common plane.

10. A device manufacturing method, comprising:
providing a beam of radiation using an illumination system;
using a patterning device to impart the beam with a pattern in its cross-section;
projecting the patterned beam of radiation onto a target portion of a substrate; and
providing a positioning device comprising a first part and a second part which are displaceable with respect to one another in at least one direction, the first part comprising a system of magnets, the second part comprising a coil assembly comprising a first coil and a second coil, the coils being arranged in a common plane, the first coil and the second coil overlapping one another partially, defining at least one crossover area where respective crossover sections of the first coil and the second coil cross one another, the crossover sections having a respective crossover section height perpendicular to the common plane, wherein the combined crossover section heights of the crossover sections in the crossover area equal at most a height of the second coil outside the at least one crossover area;
connecting the first part to one of a support for the patterning device and a table for the substrate;
connecting the second part to the other of the support and the table; and moving the support and the table with respect to each other using the positioning device.

11. A lithographic projection apparatus, comprising:

an illumination system configured to provide a beam of radiation;

a support configured to support a patterning device, the patterning device configured to impart the beam with a pattern in its cross section;

a substrate table configured to hold a substrate;

a projection system configured to project the patterned beam onto a target portion of the substrate; and a positioning device comprising a first part and a second part which are displaceable with respect to one another in at least one direction, the first part comprising a system of magnets, the second part comprising a coil assembly comprising a first coil and a second coil, the coils being arranged in a common plane, the first coil and the second coil overlapping one another partially and defining at least one crossover area where respective crossover sections of the first coil and the second coil cross one another, the crossover sections having a respective crossover section height perpendicular to the common plane, wherein the combined crossover section heights of the crossover sections in the crossover area equal at most a height of the second coil outside the at least one crossover area.

12. An apparatus according to claim 11, wherein the first part is connected to one of the support and the substrate table and the second part is connected to the other of the support and the substrate table.

13. An apparatus according to claim 11, further comprising a third coil, wherein the first coil and the second coil and the third coil are arranged in a common plane, wherein the first, second and third coils overlap one another partially in at least one crossover area and in the at least one crossover area the respective crossover sections of the first, second and third coils cross over one another.

14. An apparatus according to claim 13, wherein each coil has a first side and a second side, the first and second sides being oriented parallel to the common plane, the first and second sides being located at a distance from one another, thereby defining the height of the coil, each crossover section height of each coil is arranged between a first plane and a second plane, and the first and second plane are defined by the respective first and second sides of each coil.

15. An apparatus according to claim 13, wherein the crossover section of the second coil is positioned between the crossover sections of the first and third coils in a direction perpendicular to the common plane.

16. An apparatus according to claim 11, wherein each respective coil comprises at least one winding, and wherein the cross-sectional area of the at least one winding in a crossover section of a respective coil is smaller than the cross-sectional area of the at least one winding outside the crossover section of the respective coil.

17. An apparatus according to claim 11, wherein the respective crossover section heights of the first and the second coil are substantially equal to one another.

18. An apparatus according to claim 11, wherein the respective coils are constructed having a substantially rectangular form, each coil comprising two long legs and two short legs, and wherein the at least two coils cross one another in an area of the respective short legs.

19. A coil assembly according to claim 2, wherein the combined crossover section heights of the crossover sections in the crossover area equal at most a height of the third coil outside the at least one crossover area.

20. A positioning device according to claim 8, further comprising a third coil, wherein the first coil and the second coil and the third coil are arranged in a common plane, wherein the first, second and third coil overlap one another partially in at least one crossover area and in the at least one crossover area the respective crossover sections of the first, second and third coils cross over one another.

21. A positioning device according to claim 20, wherein the combined crossover section heights of the crossover sections in the crossover area equal at most a height of the third coil outside the at least one crossover area.

22. An apparatus according to claim 13, wherein the combined crossover section heights of the crossover sections in the crossover area equal at most a height of the third coil outside the at least one crossover area.

* * * * *